(12) United States Patent
Notani et al.

(10) Patent No.: US 10,510,396 B1
(45) Date of Patent: Dec. 17, 2019

(54) METHOD AND APPARATUS FOR INTERRUPTING MEMORY BANK REFRESH

(71) Applicant: Apple Inc., Cupertino, CA (US)

(72) Inventors: Rakesh L. Notani, Santa Clara, CA (US); Kai Lun Hsiung, Fremont, CA (US); Peter Fu, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/012,366

(22) Filed: Jun. 19, 2018

(51) Int. Cl.
*G11C 7/00* (2006.01)
*G11C 11/406* (2006.01)
*G11C 5/14* (2006.01)
*G11C 8/18* (2006.01)

(52) U.S. Cl.
CPC ........ *G11C 11/40618* (2013.01); *G11C 5/147* (2013.01); *G11C 5/148* (2013.01); *G11C 8/18* (2013.01); *G11C 11/40603* (2013.01); *G11C 11/40615* (2013.01); *G11C 2211/406* (2013.01)

(58) Field of Classification Search
CPC ... G11C 11/40618; G11C 5/147; G11C 5/148; G11C 8/18; G11C 11/40603; G11C 11/40615; G11C 2211/406
See application file for complete search history.

(56) References Cited

U.S. PATENT DOCUMENTS

| | | | |
|---|---|---|---|
| 6,704,821 B2 | 3/2004 | Scandurra et al. | |
| 8,843,805 B1* | 9/2014 | Goel | G11C 7/24 714/763 |
| 9,196,348 B2* | 11/2015 | Ware | G06F 13/1636 |
| 9,691,468 B2 | 6/2017 | Bains | |
| 2015/0127899 A1 | 5/2015 | Cordero et al. | |
| 2015/0318035 A1* | 11/2015 | Dong | G11C 11/40603 365/222 |

FOREIGN PATENT DOCUMENTS

WO 2018/004830 1/2018

* cited by examiner

*Primary Examiner* — Pho M Luu
(74) *Attorney, Agent, or Firm* — Kowert, Hood, Munyon, Rankin & Goetzel, P.C.

(57) ABSTRACT

A memory controller includes a state machine that initiates a memory refresh of a DRAM (having a number of banks) by sending thereto a refresh command. Responsive to receiving the command, the DRAM may perform a per-bank refresh in which individual ones of the banks are refreshed in succession, one at a time. Upon receiving a high priority transaction, a determination is made as to the number of memory banks that have currently been refreshed in the per-bank refresh. If the number of banks refreshed is less than a threshold value, the per-bank refresh is aborted.

20 Claims, 5 Drawing Sheets

METHOD AND APPARATUS FOR INTERRUPTING MEMORY BANK REFRESH

BACKGROUND

Technical Field

This disclosure is directed to computer systems, and more particularly, to memory subsystems.

Description of the Related Art

Memory subsystems used in many computer system include a memory controller coupled to a dynamic random access memory (DRAM). The memory controller controls traffic to and from (or writes and reads, respectively) the DRAM. The memory controller is typically coupled to other agents within the computer system, including processors/processor cores, graphics processors, I/O circuitry, and so forth. Memory controllers may include various units coupled to the memory, such as an I/O buffer, circuitry for conveying data strobe signals, and so on. Many memory controllers also include a physical layer, sometimes referred to as a PHY.

DRAMs used in many computer systems are implemented using high-speed, volatile memory chips. These memory chips can be organized into a number of different banks. Another characteristic of DRAMS is that they are volatile, meaning the data stored therein is lost upon removal of power. Furthermore, since DRAMs store data as a charge on a small capacitor, leakage can cause the data to be lost even without removing power. Accordingly, DRAM memory chips are periodically refreshed during operation. A refresh includes reading the data stored in the DRAM and writing it back into the same locations. In many modern types of DRAM chips, the circuitry for performing a refresh can be implemented thereon. Accordingly, a refresh can be conducted without the memory controller reading and re-writing the data.

SUMMARY

A method and apparatus for interrupting a memory bank refresh is disclosed. In one embodiment, a memory controller includes a state machine that initiates a memory refresh of a DRAM (having a number of banks) by sending thereto a refresh command. Responsive to receiving the command, the DRAM may perform a per-bank refresh in which individual ones of the banks are refreshed in succession, one at a time. Upon receiving a high priority transaction, a determination is made as to the number of memory banks that have currently been refreshed in the per-bank refresh. If the number of banks refreshed is less than a threshold value, the per-bank refresh is aborted.

In one embodiment, upon aborting a per-bank refresh, an all-bank refresh is performed. During the all-bank refresh, all banks of the DRAM are concurrently refreshed. Concurrent with the all-bank refresh, the memory controller may execute the high priority transaction. The high priority transaction may be, e.g., a change in a performance state, a change in frequency of a clock signal provided to the memory controller, a change in a supply voltage provided to the memory controller, and so on. The high priority transaction may also be a read from or write to the memory that is latency critical. Thus, switching to the all-bank refresh may allow the DRAM to be refreshed while limiting the time that access to the memory is unavailable.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry—that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 1:
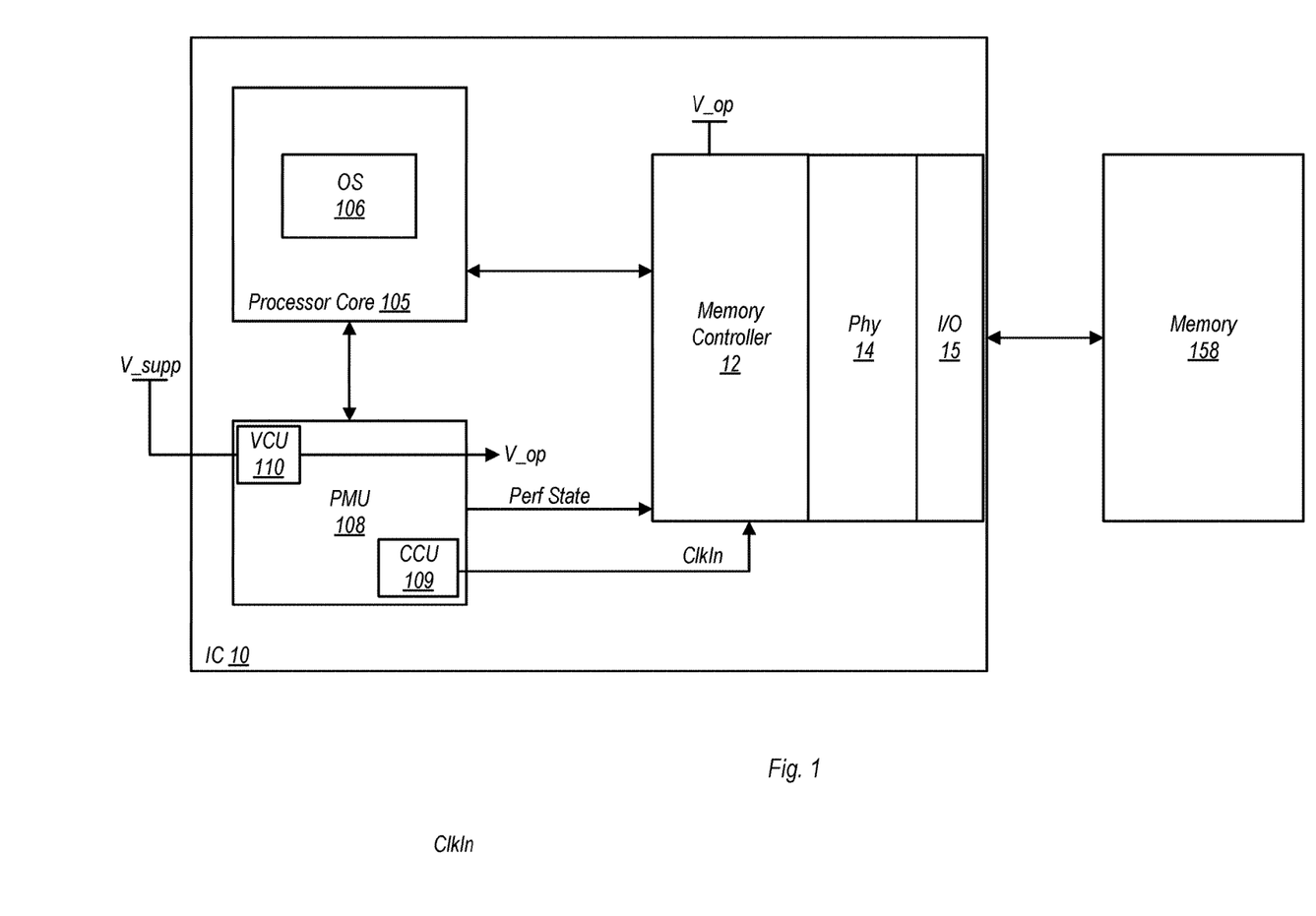
FIG. 1 is a block diagram of one embodiment of a system including a memory controller and a memory.

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 106. The instructions of OS 106 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 106 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and/or operating voltage during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both. In addition to performance state changes, PMU 108 may also put into effect clock gating and/or power gating when various functional units and/or subsystems are idle. For example, if memory controller 12 is idle for a significant amount of time, PMU 108 may place it into a power gated state (i.e. power is removed therefrom), or alternatively, a clock gated state (i.e. a clock signal is inhibited from being provided thereto).

Memory controller 12, which includes physical layer (PHY) 14 and I/O circuitry 15, provides an interface between processor core 105 and memory 158. Although not explicitly shown, IC 10 may also include one or more units of interface circuitry that are also coupled to memory controller 12 and further coupled to other devices (e.g., peripherals). Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well.

In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending performance state change to perform certain actions. These actions can, in some cases affect refresh operations in the memory, as is discussed below.

Figure 2:
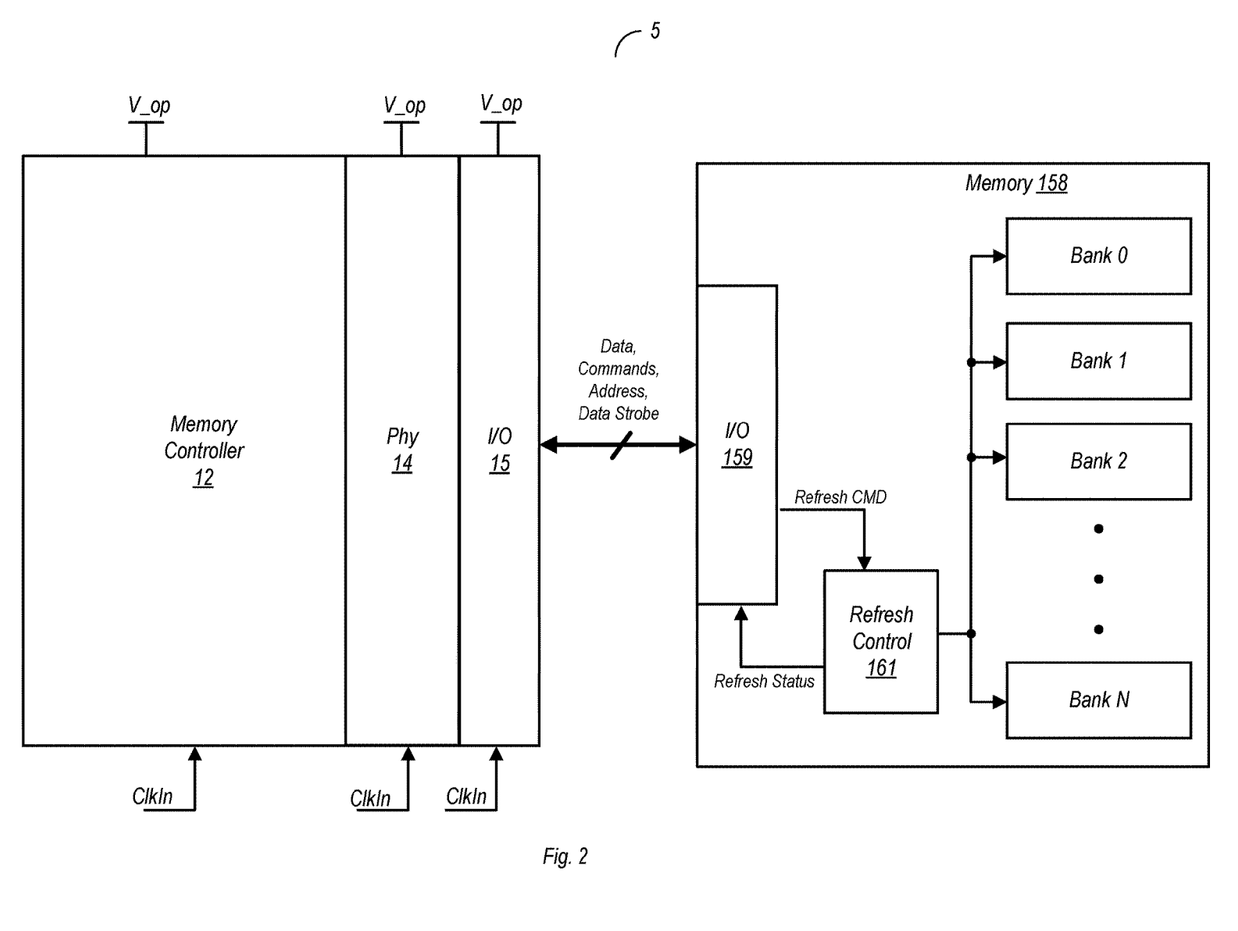
FIG. 2 is a block diagram of one embodiment of a memory subsystem

Turning now to FIG. 2, a block diagram of a system having a memory controller and a memory is shown. In the embodiment shown, system 5 includes a memory controller 12 and a memory 158. The memory controller 12 includes a physical layer 14 and an I/O unit 15, which collectively are used for interfacing with memory 158.

As previously noted, memory 158 is a DRAM, and includes a number of different memory banks (Bank 0 to Bank N) which provide the storage locations for information to be stored in memory. Each bank may be a separate memory chip in some embodiments, while other embodiments may implement multiple banks on a single memory chip. Generally speaking, the organization of the actual storage locations in terms of banks and memory chips may be any suitable arrangement for the particular application.

Memory 158 also includes an I/O unit 159, which implements circuits for various I/O functions. Among the circuits includes included in I/O unit 159 are address decoders, transmitters (for transmitting data back to memory controller 12), receivers (for receiving data from memory controller 12), and so on.

Since the various banks of memory 158 implement a DRAM, refreshes are periodically performed. Memory 158 in the embodiment shown thus includes refresh control circuit 161, which controls various aspects of performing various types of refreshes. The types of refreshes include per-bank refreshes and all-bank refreshes. When performing a per-bank refresh, individual ones of the banks are refreshed in a selected sequence, one at a time. For example, a per-bank refresh may begin refreshing Bank 0, moving onto refreshing Bank 1 after completing the refresh of Bank 0, and so on until all banks have been refreshed. In contrast, performing an all-bank refresh includes refreshing all banks of memory 158 concurrently (or effectively, simultaneously). During performance of a per-bank refresh, only the bank currently being refreshed is unavailable for memory transactions. In some cases, transactions can be delayed if a bank is about to be the next bank refreshed, although it is also possible that the refresh of a given bank can be delayed in order to satisfy a memory transaction. In either case, the general availability of memory 158 during an all-bank refresh may extend to each bank that is not currently being refreshed. In contrast, the entirety of memory 158 is unavailable for read/write transactions during an all-bank refresh.

Refresh control circuit 161 can periodically initiate a refresh (without intervention of another agent in the system) or can initiate a refresh responsive to receiving a refresh command (e.g., from circuitry within memory controller 12). Furthermore, refresh control circuit 161 is arranged to report the status of a refresh that is underway. For example, if performing a per-bank refresh, refresh control circuit 161 may provide information indicating which bank is currently being refreshed, which banks have completed the refresh, and which bank is the next one in the sequence to be refreshed. This information may be conveyed back to memory controller 12, where it can be used to manage read/write transactions, e.g., re-ordering some transactions, if possible, to utilize banks that are available. Refresh control circuit 161 may also cause a refresh to be aborted in some circumstances, as will be discussed below.

Figure 3:
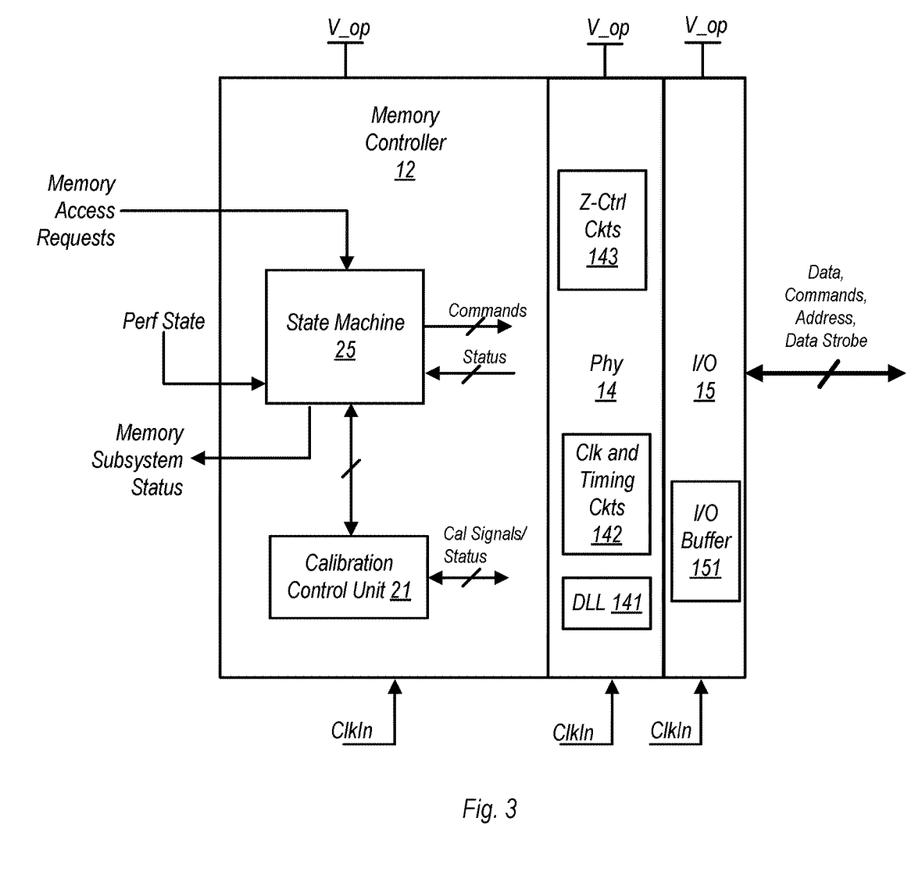
FIG. 3 is a block diagram illustrating further details of one embodiment of a memory controller.

FIG. 3 is a block diagram further illustrating one embodiment of a memory controller. In the embodiment shown, memory controller 12 includes a physical layer 14 and an I/O unit 15. Each portion of memory controller 12 is coupled to receive a supply voltage, V_op, and a clock signal, ClkIn. Although not explicitly shown, each of these portions of memory control 12 may include internal circuitry that allows for power gating and clock gating of their respectively coupled circuits. Furthermore, the operating voltage received by each may be adjusted in accordance with a performance state, by, e.g., PMU 108 of FIG. 1. Furthermore, it is possible and contemplated that the operating voltage received by each portion of memory controller 12 is independently controllable with respect to that received by other portions thereof.

Memory controller 12 in the embodiment shown includes a state machine 25 and a calibration control unit 21. State machine 25 in the embodiment shown includes logic circuitry for carrying out certain control functions in memory controller 12. Among the inputs to state machine 25 are memory access requests, performance state change notifications (or requests), inputs from calibration control unit 21, and status information from other units in the memory subsystem.

Among the various pieces of status information provided to state machine 25 is the status of refreshes conducted in memory 158. For example, if an all-bank refresh is being performed, refresh control circuit 161 in memory 158 may provide an indication of initiating the same to state machine 25 to note that the entirety of the memory will be temporarily unavailable. Similarly, refresh control circuit 161 may provide status information indicating the completion of the all-bank refresh. Responsive to this information, state machine 25 may cause a delay to requested reads and writes of memory 158 until completion of the all-bank refresh. In the case of per-bank refreshes, refresh control circuit 161 may provide an indication of the beginning of the per-bank refresh, as well as information indicating which bank (or banks) are currently undergoing refresh. Sequence information as to which bank(s) are to be refreshed next may also be provided. Information indicating the initiation and completion of refresh for individual banks may also be provided to indicate their temporary unavailability. Based on this information, state machine 25 may control the flow of read/write transactions to addresses within banks that are not currently being refreshed or whose refresh is not imminent (e.g., not the next bank in the sequence).

Calibration control unit 21 in the embodiment shown carries out various calibration functions. Within physical layer 14 are various circuits that are calibrated under the control of calibration control unit 21. Among these circuits are a delay locked loop (DLL) 141, which may in one embodiment be a master DLL upon which the settings of various other circuits (e.g., slave DLLs) may be based. Other clock and timing circuits 142 present in physical layer 14 may also be present, and may include circuits for, e.g., setting duty cycles of periodic signals, and so on. Physical layer 14 also include impedance control circuits 143 which may, among other functions, control output impedances of data signals conveyed from memory controller 12 as well as the input impedance of signals received by the same. Among the calibrations that may be performed by calibration control unit 21 of circuitry in physical layer 14 are impedance calibrations, duty cycle calibrations (to reduce duty cycle distortion), DLL calibrations, and so on.

Calibration control unit 21 is coupled to provide calibration information to state machine 25. This information may include the impending initiation of a calibration that may affect the ability to access the memory for reads and writes. Responsive to receiving such information, state machine 25 may perform various functions. One of these functions may include ensuring any information in I/O buffer 151 (used to provide temporary storage for reads and writes) is forwarded to its intended destination. This may ensure that pending reads and/or writes are completed.

State machine 25 may also respond to an indication of an imminent calibration by sending a refresh command to the memory. This may allow a refresh to be performed in parallel, and may take advantage of the time that the memory is otherwise unavailable due to the calibration. State machine 25 may also provide memory subsystem status information to other agents within the system, including PMU 108. By sending the status information to PMU 108, state machine 25 may effectively cause I/O unit 15 (or at least portions thereof) to be placed in a low power state for at least the duration of the calibration. This low power state can be a state in which all or portions of I/O unit are powered down, a reduction in the operating voltage, a reduction in the frequency of the clock signal (which can include inhibiting the clock signal altogether), or some combination thereof. The placement of circuitry in I/O unit 15 into a low power state may occur relatively quickly after sending the refresh command. Thus, in addition to utilizing the time of memory unavailability (due to the calibration) to perform a refresh, power savings may also be realized during this time.

State machine 25 can also cause various actions to be performed responsive to a high priority transaction. As defined herein, a high priority transaction may include (but is not limited to) latency sensitive reads and/or writes, pending performance state changes (e.g., change to a supply voltage and/or a clock frequency), and so on. If the state machine 25 has sent a per-bank refresh command to the memory and the per-bank refresh has not been completed, receiving the indication of the high-priority transaction causes a query of the memory to determine the number of banks that have been refreshed. If the number of banks to be refreshed is less than a threshold value (e.g., less than four of eight), state machine 25 in the embodiment shown responds by sending commands to abort the per-bank refresh and conduct an all-bank refresh. On the other hand, if the number of banks refresh meets or exceeds the threshold, the per-bank refresh may be allowed to continue to completion. In one embodiment, state machine 25 may follow completion of the per-bank refresh by initiating an all-bank refresh with a corresponding command. With respect to the high priority transaction, it may be carried out during or after the refresh is complete, depending on whether the transaction includes an exchange of data with the memory.

Figure 4:
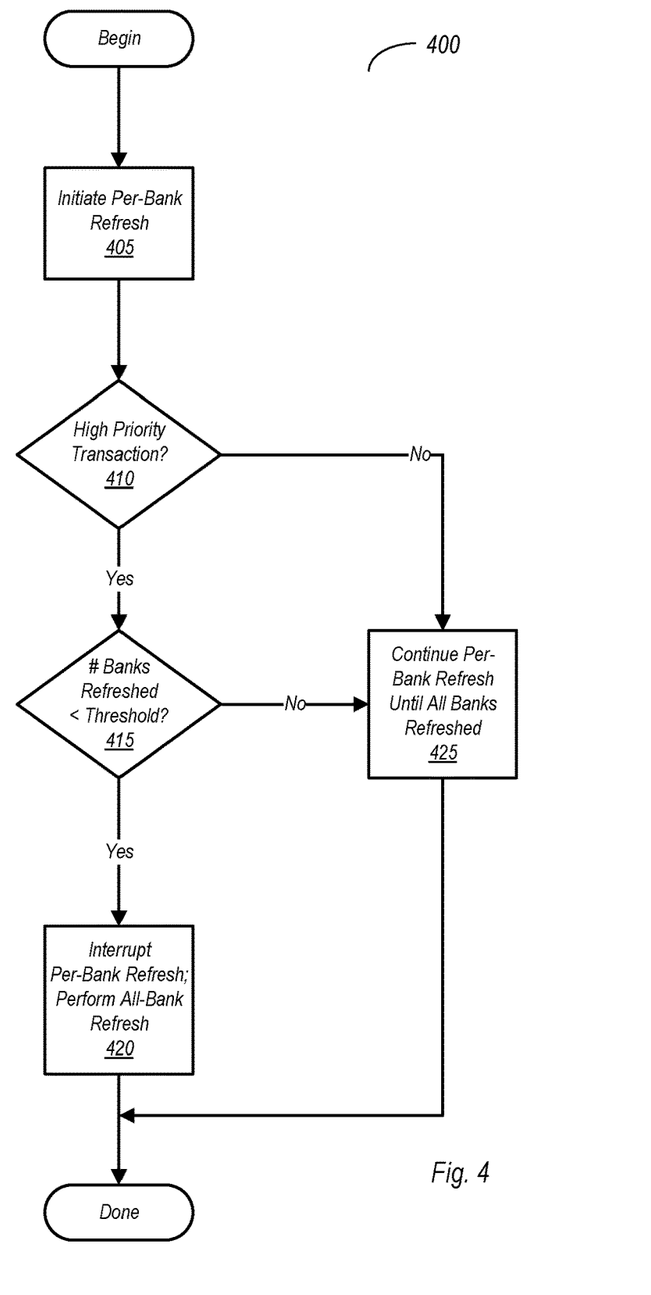
FIG. 4 is a flow diagram illustrating one embodiment of conducting a memory refresh.

FIG. 4 is a flow diagram illustrating one embodiment of conducting a memory refresh. Method 400 as shown here may be performed with various embodiments of the hardware/circuitry discussed above. Additionally, hardware/circuit embodiments not explicitly discussed herein may also perform method 400, and may thus fall within the scope of this disclosure.

Method 400 begins with the initiation of a per-bank refresh in a DRAM (block 405), where the DRAM is subdivided into a number of different banks. The per-bank refresh includes refreshing individual memory banks, one at a time, in a predetermined sequence, until all memory banks have been refreshed. If no high priority transaction are received by the memory controller during performance of the refresh (block 410, no), the per-bank refresh continues until all banks have been refreshed (block 425).

If a high priority transaction is received during the performance of the all-bank refresh (block 410, yes), a determination is made as to whether the number of banks refreshed is less than a threshold value. If the number of banks is not less than a threshold value (block 415, no), then the per-bank refresh continues until all banks have been refreshed. However, if the number of banks refreshed is less than the threshold value (bloc 415, yes), then the per-bank refresh is interrupted/aborted, and an all-bank refresh is performed (block 420).

Figure 5:
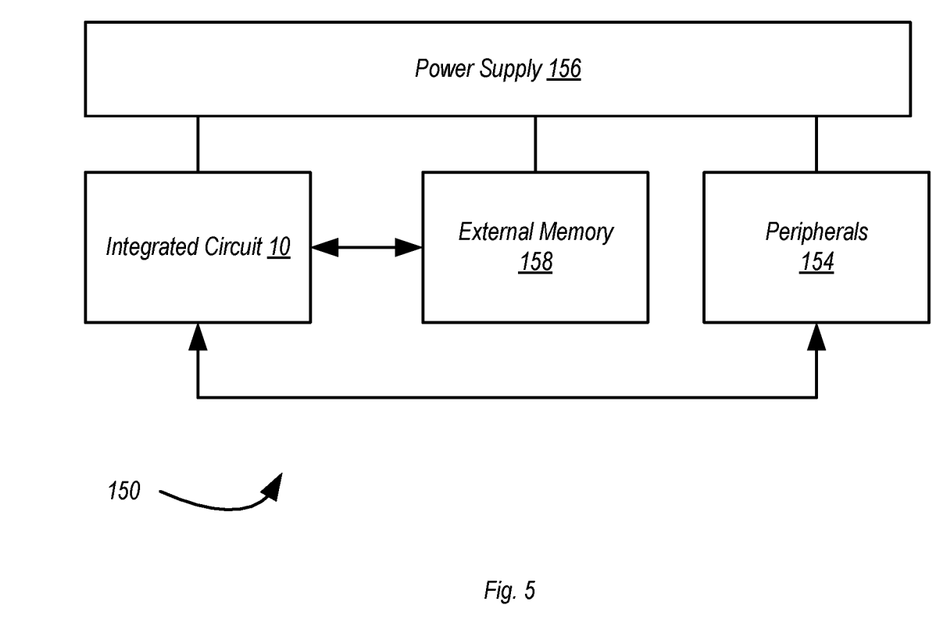
FIG. 5 is a block diagram of one embodiment of an exemplary system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a memory controller having an interface suitable for coupling to a dynamic random access memory (DRAM) having a plurality of banks, wherein the memory controller includes a state machine configured to:
send a refresh command to the DRAM to initiate a per-bank refresh, the per-bank refresh comprising successively refreshing single ones of the plurality of banks;
responsive to receiving an indication of a high-priority transaction during performing of the per-bank refresh, determining if a number of banks refreshed is at least a threshold value; and
responsive to determining that the number of banks refreshed is less than the threshold value, aborting the per-bank refresh.

2. The integrated circuit as recited in claim 1, wherein the state machine is further configured to initiate an all-bank refresh responsive to aborting the per-bank refresh, the all-bank refresh comprising performing a refresh of all of the plurality of banks concurrently.

3. The integrated circuit as recited in claim 1, wherein the state machine is further configured to, responsive to determining that the number of banks refreshed is at least threshold value, continue performing the per-bank refresh until each of the plurality of banks has been refreshed.

4. The integrated circuit as recited in claim 3, wherein the state machine is further configured to, responsive to completion of the per-bank refresh, initiate an all-bank refresh.

5. The integrated circuit as recited in claim 1, wherein the high-priority transaction comprises a performance state change to the memory controller.

6. The integrated circuit as recited in claim 1, wherein the high-priority transaction comprises changing a frequency of a clock signal provided to the memory controller.

7. The integrated circuit as recited in claim 1, wherein the high-priority transaction comprises changing a supply voltage provided to the memory controller.

8. The integrated circuit as recited in claim 1, wherein the high-priority transaction comprises executing a command to power down at least a portion of the memory controller.

9. A method comprising:
in a memory subsystem, a memory controller initiating a memory refresh of a dynamic random access memory (DRAM), wherein the DRAM includes a plurality of memory banks;
performing a per-bank refresh of the DRAM, wherein the per-bank refresh comprises successively refreshing single ones of the plurality of banks;
receiving, at the memory controller, a high priority transaction during the performing of the per-bank refresh;
determining if a number of memory banks refreshed during the per-bank refresh is currently at least a threshold value; and
responsive to determining that the number of memory banks refreshed during the per-bank refresh is less than the threshold value, aborting the per-bank refresh.

10. The method as recited in claim 9, further comprising initiating an all-bank refresh responsive to aborting the per-bank refresh, the all-bank refresh comprising performing a refresh of all of the plurality of banks concurrently.

11. The method as recited in claim 9, further comprising, responsive to determining that the number of banks refreshed is at least threshold value, continuing performance of the per-bank refresh until each of the plurality of banks has been refreshed.

12. The method as recited in claim 11, further comprising initiating an all-bank refresh responsive to completion of the per-bank refresh.

13. The method as recited in claim 9, wherein the high priority transaction comprises a performance state change to the memory controller.

14. The method as recited in claim 9, wherein the high priority transaction comprises changing a frequency of a clock signal provided to the memory controller.

15. The method as recited in claim 9, wherein the high priority transaction comprises changing a supply voltage provided to the memory controller.

16. The method as recited in claim 9, wherein the high priority transaction comprises executing a command to power down at least a portion of the memory controller.

17. A system comprising:
a dynamic random access memory (DRAM), the DRAM having a plurality of banks;
a memory controller having an interface coupled to the DRAM, the memory controller including a state machine configured to:
send a refresh command to the DRAM to initiate a per-bank refresh, the per-bank refresh comprising successively refreshing single ones of the plurality of banks of the DRAM;
responsive to receiving an indication of a high-priority transaction during performing of the per-bank refresh, determining if a number of banks refreshed is at least a threshold value; and
responsive to determining that the number of banks refreshed is less than the threshold value, aborting the per-bank refresh.

18. The system as recited in claim 17, wherein the state machine is further configured to initiate an all-bank refresh responsive to aborting the per-bank refresh, the all-bank refresh comprising performing a refresh of all of the plurality of banks concurrently.

19. The system as recited in claim 17, wherein the state machine is further configured to:
responsive to determining that the number of banks refreshed is at least threshold value, continue performing the per-bank refresh until each of the plurality of banks has been refreshed; and
wherein the state machine is further configured to, responsive to completion of the per-bank refresh, initiate an all-bank refresh.

20. The system as recited in claim 17, wherein the high-priority transaction comprises one or more of the following:
changing a frequency of a clock signal provided to the memory controller;
changing a supply voltage provided to the memory controller;
placing the memory controller in a power down state.

* * * * *